(12) United States Patent
Shimizu et al.

(10) Patent No.: US 7,843,130 B2
(45) Date of Patent: Nov. 30, 2010

(54) ORGANIC LIGHT-EMITTING APPARATUS

(75) Inventors: Shinichiro Shimizu, Yokohama (JP); Hideo Mori, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 189 days.

(21) Appl. No.: 12/174,859

(22) Filed: Jul. 17, 2008

(65) Prior Publication Data
US 2009/0058273 A1 Mar. 5, 2009

(30) Foreign Application Priority Data

Aug. 27, 2007 (JP) ............................. 2007-219569
Jul. 8, 2008 (JP) ............................. 2008-177759

(51) Int. Cl.
*H01J 1/00* (2006.01)
*H01J 1/54* (2006.01)

(52) U.S. Cl. ...................... 313/504; 313/496; 313/503; 445/23

(58) Field of Classification Search ................. 313/504, 313/498, 503
See application file for complete search history.

(56) References Cited

U.S. PATENT DOCUMENTS

| | | | | |
|---|---|---|---|---|
| 5,714,968 | A | 2/1998 | Ikeda | ........................... 345/77 |
| 2002/0011783 | A1 | 1/2002 | Hosokawa | ................... 313/504 |
| 2004/0160170 | A1 | 8/2004 | Sato et al. | ................... 313/504 |
| 2005/0225237 | A1* | 10/2005 | Winters | ....................... 313/506 |
| 2007/0046180 | A1* | 3/2007 | Kao et al. | .................... 313/504 |
| 2007/0152920 | A1 | 7/2007 | Yamashita et al. | ............ 345/76 |
| 2008/0001875 | A1 | 1/2008 | Yuuki et al. | ................... 345/87 |

FOREIGN PATENT DOCUMENTS

| | | |
|---|---|---|
| JP | 08-054836 | 2/1996 |
| JP | 2001-230086 | 8/2001 |
| JP | 2004-207217 | 7/2004 |
| JP | 2005-158493 | 6/2005 |
| JP | 2005158493 A * | 6/2005 |
| JP | 2007-102046 | 4/2007 |

* cited by examiner

*Primary Examiner*—Bumsuk Won
*Assistant Examiner*—Nathaniel J Lee
(74) *Attorney, Agent, or Firm*—Fitzpatrick, Cella, Harper & Scinto

(57) ABSTRACT

Provided is an organic light-emitting apparatus which can allow each of a plurality of organic light-emitting elements of different emission colors to emit light under optimum conditions. The organic light-emitting apparatus includes: a substrate; a plurality of organic light-emitting elements of different emission colors disposed on the substrate and each having formed sequentially on the substrate, a first electrode formed independently for each of the plurality of organic light-emitting elements, an organic functional layer, and a light-transmissive second electrode continuously formed extending over the plurality of organic light-emitting elements; a conductive layer formed between the substrate and the first electrode and electrically connected to the second electrode; and an insulating layer formed between the conductive layer and the first electrode, in which the insulating layer is different in at least one of thickness and material for each of the different emission colors.

2 Claims, 3 Drawing Sheets

LIGHT EMISSION DIRECTION

ORGANIC LIGHT-EMITTING APPARATUS

BACKGROUND OF THE INVENTION

1. Field of the Invention

The present invention relates to an organic light-emitting apparatus using an organic light-emitting element.

2. Description of the Related Art

As a light-emitting apparatus in which light-emitting elements are disposed in a matrix pattern to constitute a display surface, there is known an organic light-emitting apparatus using an electroluminescent element (organic EL element) having light-emitting layers formed of an organic light-emitting material. In such a light-emitting apparatus, since the elements constituting pixels emit light by themselves, there are advantages that there is no need for provision of a backlight unlike a liquid crystal display, that the response speed is large, and that the viewing angle dependency is small. These advantages make the light-emitting apparatus promising as a flat panel display that succeeds to the liquid crystal display.

A conventional organic EL element has a structure in which a hole injection electrode (anode), an EL light-emitting layer (hereinafter sometimes, referred to as "emission layer", and an electron injection electrode (cathode) are stacked in the mentioned order. In an organic EL element with such a structure, electrons injected from the cathode into the EL emission layer and holes injected from the anode to the EL emission layer are recombined to generate excitons. The organic EL element emits light by utilizing light emitted when the excitons return to a ground state.

Known light-emitting apparatuses that use organic EL elements include an active matrix type organic light-emitting apparatus. A conventional active matrix type light-emitting apparatus controls the emission luminance through amplitude modulation or time modulation while controlling on/off of light emission by switching with TFTs on and off (see Japanese Patent Application Laid-Open No. H08-054836). In the active matrix light-emitting apparatus, a first electrode on the TFT substrate side is patterned pixel electrodes and a second electrode opposing the substrate is a common electrode. Further, by adopting a top emission structure in which light is extracted from the side opposite to the substrate side, the pixel aperture ratio can be improved and higher luminance and higher definition can be obtained.

In the organic light-emitting apparatus adopting the top emission structure where light is extracted from the side opposite to the substrate side, the first electrode is desirably formed of a highly reflective material and the second electrode needs to be formed of a transparent conductive film. The first electrode is often formed of a conductive film having high reflectance or a stack of a transparent conductive film and a metal conductive film having high reflectance. Indium tin oxide (ITO), for example, is employed as the transparent conductive film. However, most of transparent conductive materials including ITO are low in conductivity and, when used for a common electrode for pixels, cause a voltage drop due to the sheet resistance thereof. As a result, the current that flows in the pixels becomes nonuniform and unevenness of the emission luminance is generated in the display surface.

As a solution to this problem, Japanese Patent Application Laid-Open No. 2001-230086 discloses a method of reducing surface resistance by forming a second electrode of a main electrode and an auxiliary electrode. Japanese Patent Application Laid-Open No. 2004-207217 discloses a solution in which a layer that is identical to a layer constituting a first electrode is disposed between pixels and allowed to function as an auxiliary electrode of a second electrode.

Further, Japanese Patent Application Laid-Open No. 2005-158493 discloses a structure in which a cathode line (conductive portion) is provided between a pixel electrode, which is a substrate side electrode, and a substrate, and a planarizing insulating film is provided between the pixel electrode and the cathode line.

However, in the case where an auxiliary electrode is disposed between pixels as disclosed in Japanese Patent Application Laid-Open Nos. 2001-230086 and 2004-207217, there is a problem that the pixel aperture ratio is reduced.

On the other hand, in the EL apparatus disclosed in Japanese Patent Application Laid-Open No. 2005-158493, the reduction of pixel aperture ratio is suppressed to some degree since the cathode line (conductive portion) is provided below the pixel electrode. However, when the cathode line provided below the pixel electrode has an electric potential different from that of the pixel electrode, a capacitance is generated between the two. The influence of such a capacitance on light emission of an organic light-emitting element is not considered in Japanese Patent Application Laid-Open No. 2005-158493. In particular, the influence of such a capacitance on light emission of organic light-emitting elements of different emission colors that together constitute an organic light-emitting apparatus.

Further, when the conductive layer provided below the pixel electrode is a reflective layer, light emitted from an organic functional layer is reflected by the reflective layer, thereby causing optical interference. However, the influence of optical interference is not considered in Japanese Patent Application Laid-Open No. 2005-158493. In particular, in the case of an organic light-emitting apparatus with organic light-emitting elements of different emission colors, the conditions of optical interference vary depending on the emission color, which has, however, not been considered.

SUMMARY OF THE INVENTION

The present invention has been accomplished in consideration of the various influences exerted on organic light-emitting elements when a conductive layer is provided below a pixel electrode, and it is an object of the present invention to provide an organic light-emitting apparatus which can allow each of a plurality of organic light-emitting elements of different emission colors to emit light under optimum conditions.

In order to solve the above problems, the present invention provides an organic light-emitting apparatus, including: a substrate; a plurality of organic light-emitting elements arranged on the substrate and having different emission colors from one another, the plurality of organic light-emitting elements each having: a first electrode, which is formed independently for each of the plurality of organic light-emitting elements; an organic functional layer; and a second electrode, which is light-transmissive and stretches continuously over the plurality of organic light-emitting elements, the first electrode, the organic functional layer, and the second electrode being formed in order on the substrate; a conductive layer formed between the substrate and the first electrode and electrically connected to the second electrode; and an insulating layer formed between the conductive layer and the first electrode, in which the insulating layer is varied in one of thickness and material depending on the emission colors.

The organic light-emitting apparatus of the present invention can make the plurality of organic light-emitting elements of different emission colors emit light under optimum conditions which are determined specifically to the respective organic light-emitting elements of different emission colors taking into account how placing the conductive layer under the pixel electrode affects the plurality of organic light-emitting elements in various ways.

Further features of the present invention will become apparent from the following description of exemplary embodiments with reference to the attached drawings.

DESCRIPTION OF THE EMBODIMENTS

First Embodiment

First, as an organic light-emitting apparatus of the present invention, a structure in which a conductive layer provided between a first electrode and a substrate is used as auxiliary line of a second electrode will be described. In the structure, the conductive layer is a reflective layer, and an insulating layer provided between the first electrode and the conductive layer is designed taking into consideration the effect of optical interference caused when light emitted from an organic functional layer is reflected by the conductive layer.

Figure 1:
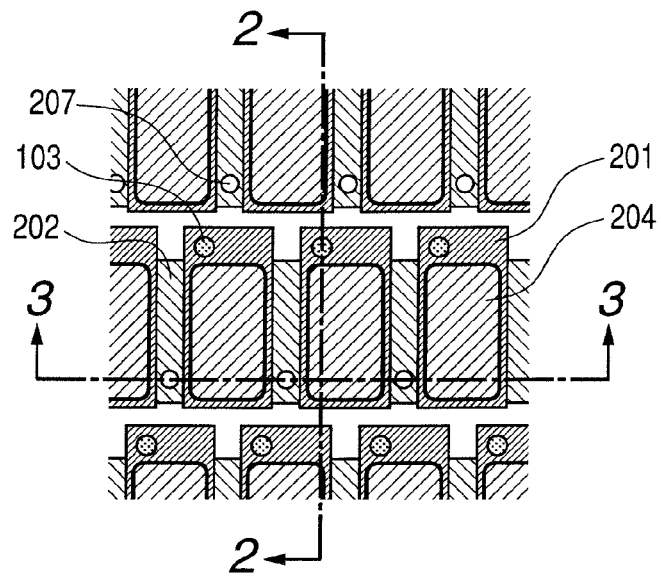
FIG. 1 is a schematic plan view illustrating a pixel portion of an organic light-emitting apparatus according to the present invention.
Figure 2:
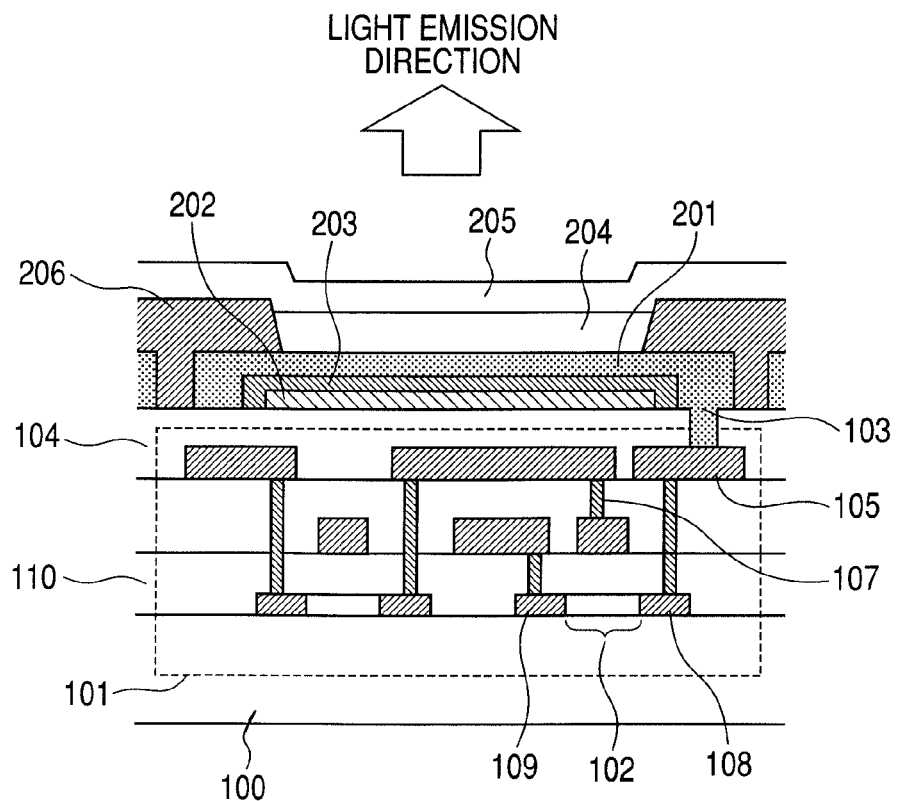
FIG. 2 is a schematic cross-sectional view taken along line 2-2 of FIG. 1.
Figure 3:
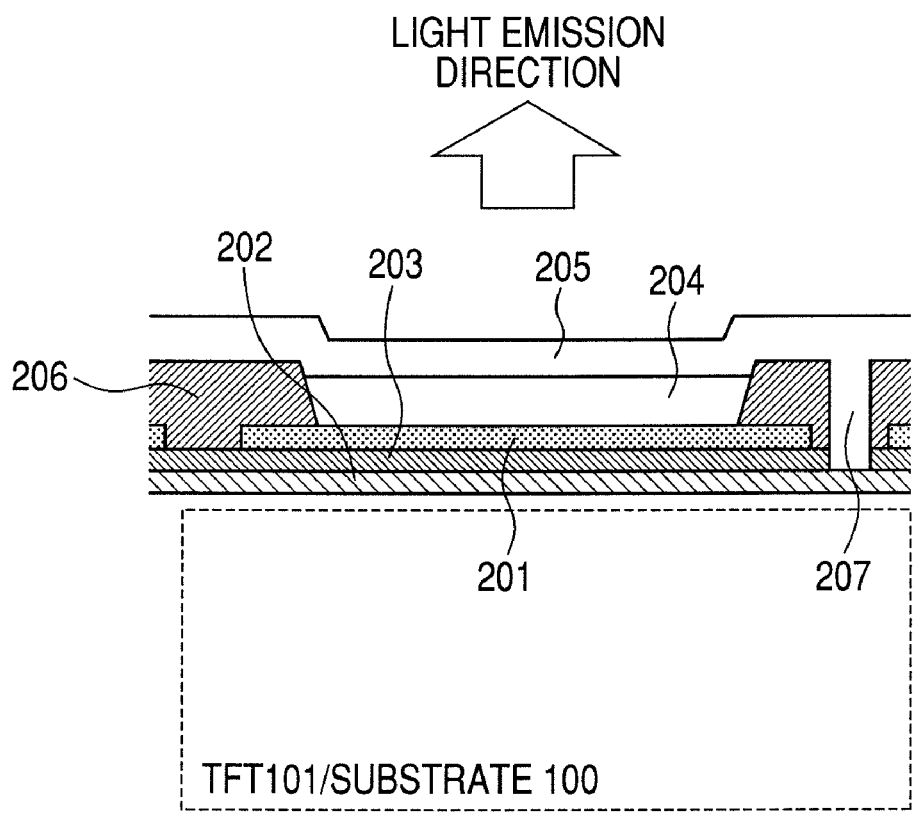
FIG. 3 is a schematic cross-sectional view taken along line 3-3 of FIG. 1.

FIG. 1 is a schematic plan view of a pixel portion of an organic light-emitting apparatus according to an embodiment of the present invention, FIG. 2 is a schematic cross-sectional view taken along line 2-2 of FIG. 1, and FIG. 3 is a schematic cross-sectional view taken along line 3-3 of FIG. 1.

The organic light-emitting apparatus according to the embodiment of the present invention has a substrate 100, which is, for example, an insulating substrate made of glass, a synthetic resin, or the like, or a conductive or semiconductive substrate having an insulating film such as a silicon oxide ($SiO_2$) film or a silicon nitride ($SiN_x$) film formed on a surface thereof. The substrate 100 may be either transparent or opaque.

Formed on the substrate 100 is a TFT 101 for driving each of a plurality of organic light-emitting elements (organic EL elements). The TFT 101 has a poly-Si layer 102, which is an active layer made of polysilicon and which may be replaced by an amorphous silicon layer, a microcrystalline silicon layer, or the like. The TFT 101 may either be a P-ch TFT or an N-ch TFT. In FIG. 2, reference numerals 107, 108, 109, and 110 denote a gate electrode, a drain region, a source region, and a gate insulating film of the TFT 101, respectively.

An interlayer insulating film 104 is formed for planarizing the unevenness formed by the TFT 101, and organic EL elements each having a first electrode 201, an organic functional layer 204, and a second electrode 205 are disposed thereon in two directions in the plane of the organic light-emitting apparatus.

Between the first electrode 201 of the organic EL element and the interlayer insulating film 104, a conductive layer (reflective auxiliary line) 202 is formed. The conductive layer 202 has both a function of reflecting light that has been emitted from the organic functional layer 204 and a function as auxiliary line for reducing a voltage drop in the second electrode 205.

The conductive layer 202 is desirably a reflective member which is constituted of an elemental metal having both a low resistance and a high reflectance such aluminum (Al) or an alloy thereof. The conductive layer 202 is formed on the interlayer insulating film 104 in a stripe pattern as illustrated in FIG. 1 by, for example, sputtering or lithography.

The conductive layer 202 can take any shape in the plane as long as the conductive layer 202 is formed in a region that overlaps with the organic functional layer 204 and that does not overlap with a first contact hole 103 (opening) through which the first electrode 201 and a drain electrode 105 of the TFT 101 are electrically connected to each other. However, it is desirable that the conductive layer 202 is formed so as to occupy as much display area as possible and is continuously formed extending over as many pixels as possible. In this embodiment, the conductive layer 202 is continuously formed extending over the plurality of organic EL elements in one of two directions in the plane of the organic light-emitting apparatus, and is discontinuous at portions between the plurality of organic light-emitting elements in the other of the two directions. Alternatively, the conductive layer 202 may be formed uniformly throughout the plane of the organic light-emitting apparatus except the first contact holes 103. By employing such a configuration, the effect of reducing a voltage drop is improved.

The conductive layer 202 is isolated from the first electrode 201 by an insulating layer 203 formed between the first electrode 201 and the conductive layer 202. The insulating layer 203 is a light-transmissive member for transmitting light from the organic functional layer 204 to the conductive layer 202. It is desirable that the insulating layer 203 is formed of the same material as that of the element separation layer 206.

The first electrode 201 is a transparent electrode formed on the insulating layer 203 by patterning corresponding to each pixel (for each organic light-emitting element), in other words, an electrode formed independently for each organic light-emitting element. The first electrode 201 is constituted of a transparent conductive oxide film which contains a compound of tin oxide and indium oxide, a compound of tin oxide and zinc oxide, or the like.

The first electrode 201 is electrically connected to the drain electrode 105 of the TFT 101 via the first contact hole 103 formed in the interlayer insulating film 104. It is desirable that the first contact hole 103 is formed in a non-light-emitting portion which is a place covered with the element separation layer 206.

The element separation layer 206 is an insulating film that covers the periphery of the first electrode 201 and separates the pixels. Examples of the material employed for the element separation layer 206 include an inorganic insulating film such as of silicon oxynitride, silicon oxide, a film such as of an acrylic resin, a polyimide resin, a novolac resin, or the like.

In the element separation layer 206, a second contact hole (opening) 207 is formed for electrically connecting the conductive layer 202 and the second electrode 205.

Figure 4:
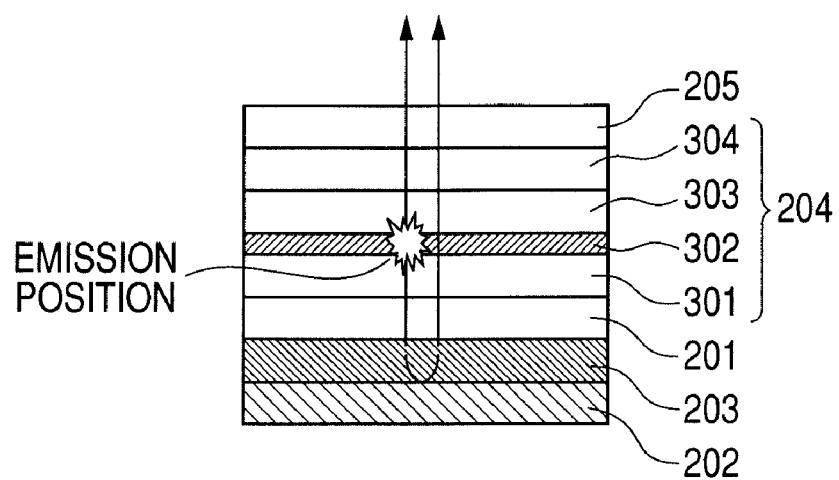
FIG. 4 is a schematic cross-sectional view illustrating an example of an organic EL element structure of an organic light-emitting apparatus according to a first embodiment of the present invention.

The organic functional layer 204 is formed on the first electrode 201. Given as an example of the organic functional layer 204 is a structure such as illustrated in FIG. 4 in which a hole-transporting layer 301, an emission layer 302, a carrier blocking layer 303, and an electron injection layer 304 are formed in the mentioned order by vacuum evaporation. The organic functional layer 204 may be a single layer constituted of only the emission layer 302 or may have a plurality of layers. In either case, the organic functional layer 204 is separated from all the adjacent pixels by the element separation layer 206.

The material of the emission layer 302 varies depending on the emission color of the layer. Emission layers of different emission colors are formed separately by patterning through such a process as mask evaporation, an ink jet method, or a transfer method. The emission layers of different emission colors may have either different thicknesses or the same thickness.

The second electrode 205 is a light-transmissive electrode which is continuously formed so as to extend over the plurality of organic light-emitting elements. The second electrode 205 is formed on the organic functional layer 204 and the element separation layer 206 by, for example, sputtering, and is electrically connected to the conductive layer 202 via the second contact hole 207. The second electrode 205 is, similarly to the first electrode 201, formed of a transparent conductive oxide film which contains a compound of tin oxide and indium oxide, a compound of tin oxide and zinc oxide, or the like.

In the present invention, any one of the first electrode and the second electrode can be used as an anode. When the first electrode is an anode, the TFT 101 (driving TFT) for controlling the driving of each organic light-emitting element is a P-ch TFT, and the layers constituting the organic functional layer 204 are stacked sequentially starting from a layer that has a hole-transporting function. On the other hand, when the first electrode is a cathode, the driving TFT is an N-ch TFT and the layers constituting the organic functional layer 204 are stacked sequentially starting from a layer that has an electron-transporting function.

In this embodiment, since the conductive layer 202 is formed between the substrate 100 and the first electrode 201, forming the conductive layer 202 does not reduce the pixel aperture ratio.

In addition, since the conductive layer 202 serves as an auxiliary line of the second electrode 205 to thereby reduce the sheet resistance of the second electrode 205 and also to reduce the fluctuation of a current flowing in the organic functional layer 204, display with uniform emission luminance can be performed.

Further, since the conductive layer 202 serves also as a reflective layer for allowing light to exit upwardly with respect to the substrate 100, there is no need for constituting an anode of a two-layer structure of a transparent conductive film and a high-reflectance metal film, which prevents the production steps from being complicated.

By the use of the light reflection caused by the conductive layer 202, the light emitted from the organic functional layer 204 can be enhanced by utilizing the effect of optical interference. The enhancement of the light through optical interference can be attained by setting a difference of plural optical paths (optical path difference) so as to meet the conditions for enhancement.

The optical path difference can suitably be selected in the thickness direction of the organic light-emitting apparatus. For example, the optical path difference may be one between a light emission position (peak position in emission intensity distribution) defined within the organic functional layer 204 (within organic emission layer) and a reflective surface of the conductive layer 202, or may be one between a reflective surface of the second electrode 205 and the reflective surface of the conductive layer 202. The reflective surface of the second electrode 205 is an interface (upper interface) of the second electrode 205 that is located on a side opposite to the substrate 100 side when the second electrode 205 is a transparent electrode formed of a transparent conductive oxide film and a difference in refractive index is to be utilized. When the second electrode 205 is a translucent reflective layer formed of a metal thin film or the like, the reflective surface of the second electrode 205 is an interface (lower interface) of the second electrode 205 that is located on the organic functional layer 204 side.

When applying such a structure utilizing the effect of optical interference to a plurality of organic light-emitting elements of different emission colors, the optical path difference needs to be varied depending on the emission color. A first method to accomplish this in the present invention is to allow the thickness of the insulating layer 203, which is provided between the first electrode 201 and the conductive layer 202, to differ among the plurality of organic light-emitting elements of different emission colors. Further, the respective thicknesses are set such that light emitted from the organic functional layer 204 is enhanced. A second method is to allow the refractive index of the insulating layer 203, which is provided between the first electrode 201 and the conductive layer 202, to differ among the plurality of organic light-emitting elements of different emission colors. In short, different materials are used to form the insulating layer 203 for the different emission colors. Further, the respective refractive indices are set such that light emitted from the organic functional layer 204 is enhanced.

By setting the thickness or the refractive index of the insulating layer 203 as described above, the light extraction efficiency of a plurality of organic light-emitting elements of different emission colors can be improved.

The different emission colors in the present invention can be combination of any emission colors, for example, three colors of red, green and blue. However, combination of four colors including the three colors and an additional white color may also be employed.

Second Embodiment

Described next as an organic light-emitting apparatus of the present invention is a structure in which a conductive layer is provided between a substrate and a first electrode, which is a substrate side electrode, and an insulating layer provided between the first electrode and the conductive layer is designed taking into consideration a capacitance generated between the first electrode and the conductive layer.

This embodiment is described with reference to FIGS. 1 and 2, focusing on components different from those in the first embodiment.

In this embodiment, the conductive layer 202 and the first electrode 201 constitute a capacitor. The capacitor is provided in order to prevent variance of luminance which is caused by variance in mobility of the driving TFTs throughout the plane of the organic light-emitting apparatus. A specific circuit structure is disclosed in Japanese Patent Application Laid-Open No. 2007-102046. The structure of the present invention which includes the capacitor is particularly effective for a structure in which another capacitor for holding a data signal is provided between a controlling electrode (gate) of a driving TFT and a main electrode (source or drain) to which an organic light-emitting element is connected.

In other words, the conductive layer 202 has both a function as an auxiliary line for reducing a voltage drop in the second electrode 205 and a function as a layer that constitutes a capacitor for preventing variance of luminance throughout the plane of the organic light-emitting apparatus, which are caused by variance in mobility of the driving TFTs.

The conductive layer 202 is desirably formed of a reflective member in order to reflect light emitted from the organic functional layer 204. However, the conductive layer 202 does not necessarily need to be formed of a reflective member and may be formed of a transparent member. When the conductive layer 202 is formed of a reflective member, the light extraction efficiency can be improved by utilizing the effect of optical interference as described in the first embodiment. On the other hand, when the conductive layer 202 is formed of a transparent member, it is desirable to constitute the first electrode 201 of a reflective member such that optical interference can be utilized. In this case, the insulating layer 203 is not a layer in which an optical path difference is produced. Accordingly, the insulating layer 203 does not need to be formed of a transparent member, and can be formed of a material having a suitable dielectric constant as an insulating layer that constitutes a capacitor.

Figure 5:
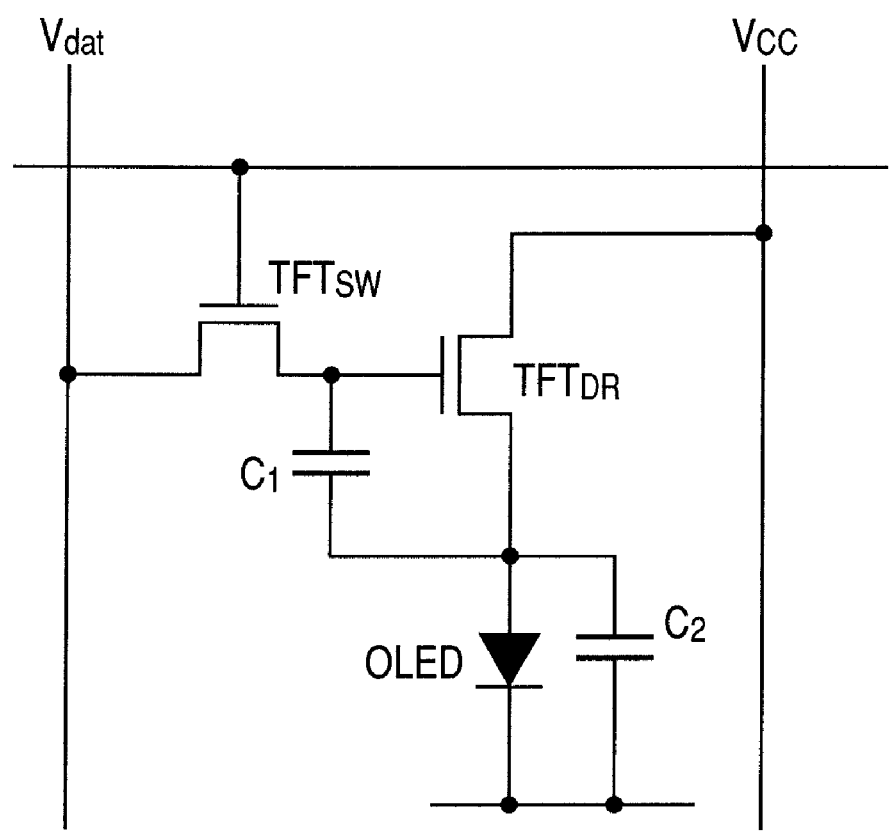
FIG. 5 is a diagram illustrating an example of a drive circuit of an organic light-emitting apparatus according to a second embodiment of the present invention.

FIG. 5 is a diagram illustrating an example of a drive circuit of the organic light-emitting apparatus according to the second embodiment of the present invention. In FIG. 5, an organic light-emitting element is denoted by OLED, a driving TFT is denoted by $TFT_{DR}$, and a capacitor constituted of the first electrode and the conductive layer is denoted by $C_2$. A switching TFT is denoted by $TFT_{SW}$, and another capacitor for holding a data signal is denoted by $C_1$. By adjusting the capacitor $C_2$, the capacitance that is held in $C_1$ when a current corresponding to a data signal is flowed in the driving TFT varies, variance in mobility among the driving TFTs can be prevented.

When such a structure in which the conductive layer 202 and the insulating layer 203 are provided to constitute a capacitor is applied to an organic light-emitting apparatus that has a plurality of organic light-emitting elements of different emission colors, it is desirable to vary the capacitance of the capacitor depending on the emission color. This is because the capacitance generated between the first electrode 201 and the second electrode 205 of an organic light-emitting element varies depending on the emission color. This is attributable to the fact that the layer constituting the organic functional layer differs in material or thickness for each of the different emission colors. That is, it is desirable that the sum of a capacitance generated between the first electrode 201 and the second electrode 205 and a capacitance generated between the first electrode 201 and the conductive layer 202 is constant irrespective of the emission color.

As the method of varying the capacitance generated between the first electrode 201 and the conductive layer 202 depending on the emission color, there is a method in which the thickness of the insulating layer 203 is varied or the dielectric constant of the insulating layer 203 is varied. Further, the respective capacitances are set such that the sum of the capacitance generated between the first electrode 201 and the second electrode 205 and the capacitance generated between the first electrode 201 and the conductive layer 202 is identical. Specifically, it is set such that the larger the capacitance between the first electrode 201 and the second electrode 205, the larger the thickness of the insulating layer 203. Alternatively, it is set such that the larger the capacitance between the first electrode 201 and the second electrode 205, the larger the dielectric constant of the insulating layer 203. By employing such a structure, more uniform light emission can be obtained from a plurality of organic light-emitting elements of different emission colors.

Although the embodiments of the organic light-emitting apparatus according to the present invention have been described above, the organic light-emitting apparatus according to the present invention is applicable to various uses including lighting, a display of an electronic equipment, and a backlight for a display device. Examples of the display of an electronic equipment include a display of each of a television receiver and a personal computer, a rear display portion of an imaging device, a display screen of a mobile phone, and a display portion of a portable game machine. Other uses include a display portion of a portable music player, a display portion of a portable digital assistant (PDA), and a display portion of a car navigation system.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2007-219569, filed Aug. 27, 2007, and No. 2008-177759, filed Jul. 8, 2008, which are hereby incorporated by reference herein in their entirety.

What is claimed is:

1. An organic light-emitting apparatus, comprising:
   a substrate;
   a plurality of organic light-emitting elements of different emission colors disposed on the substrate and each having formed sequentially on the substrate:
   a first electrode formed independently for each of the plurality of organic light-emitting elements;
   an organic functional layer; and
   a light-transmissive second electrode continuously formed extending over the plurality of organic light-emitting elements;
   a conductive layer formed between the substrate and the first electrode and electrically connected to the second electrode; and
   an insulating layer formed between the conductive layer and the first electrode,
   wherein the insulating layer is different in at least one of thickness and material for each of the different emission colors,
   wherein the insulating layer is different in thickness for each of the plurality of organic light-emitting elements of different emission colors, and wherein the thickness of the insulating layer is set such that the larger a capacitance between the first electrode and the second electrode, the larger the thickness of the insulating layer.

2. An organic light-emitting apparatus, comprising:
   a substrate;
   a plurality of organic light-emitting elements of different emission colors disposed on the substrate and each having formed sequentially on the substrate:
   a first electrode formed independently for each of the plurality of organic light-emitting elements;
   an organic functional layer; and
   a light-transmissive second electrode continuously formed extending over the plurality of organic light-emitting elements;
   a conductive layer formed between the substrate and the first electrode and electrically connected to the second electrode; and
   an insulating layer formed between the conductive layer and the first electrode, wherein the insulating layer is different in at least one of thickness and material for each of the different emission colors, wherein the insulating layer is different in dielectric constant for each of the plurality of organic light-emitting elements of different emission colors, and wherein the dielectric constant of the insulating layer is set such that the larger a capacitance between the first electrode and the second electrode, the larger the dielectric constant of the insulating layer.

* * * * *